(12) United States Patent
Gurevitch et al.

(10) Patent No.: US 7,724,014 B2
(45) Date of Patent: May 25, 2010

(54) ON-CHIP SERVO LOOP INTEGRATED CIRCUIT SYSTEM TEST CIRCUITRY AND METHOD

(75) Inventors: Mihail Gurevitch, Tucson, AZ (US); Herbert Braisz, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 210 days.

(21) Appl. No.: 12/150,042

(22) Filed: Apr. 24, 2008

(65) Prior Publication Data
US 2009/0206864 A1 Aug. 20, 2009

Related U.S. Application Data

(60) Provisional application No. 61/072,212, filed on Mar. 28, 2008.

(51) Int. Cl.
*G01R 31/02* (2006.01)
*G01R 31/26* (2006.01)

(52) U.S. Cl. .................... 324/763; 324/765

(58) Field of Classification Search ........... None
See application file for complete search history.

(56) References Cited

U.S. PATENT DOCUMENTS

| 6,339,388 B1 * | 1/2002 | Matsumoto | 324/158.1 |
| 6,937,048 B2 * | 8/2005 | Eichin et al. | 324/765 |
| 6,937,051 B2 * | 8/2005 | Eichin et al. | 324/765 |
| 2001/0015653 A1 * | 8/2001 | De Jong et al. | 324/763 |

* cited by examiner

*Primary Examiner*—Jermele M Hollington
(74) *Attorney, Agent, or Firm*—John J. Patti; Wade J. Brady, III; Frederick J. Telecky, Jr.

(57) ABSTRACT

Internal servo loop circuitry is included on the same chip (10C) with an ADC (10B). Automatic test equipment (12) operates with the internal servo loop circuitry and external servo loop circuitry (1B) to test the ADC. The internal servo loop circuitry includes a target register (14), a digital comparator (18), and a crossover counter (22). An integrator (32) responsive to the digital comparator (18) produces an input signal (Vin) to the ADC, which generates a corresponding digital output sample (Dout). The comparator compares the output sample with a target code in the target register and causes the direction of the input signal to reverse each time the digital output sample crosses over the target code. The counter causes a voltmeter to measure a transition voltage value of the input voltage after a predetermined number of crossovers.

21 Claims, 7 Drawing Sheets

ON-CHIP SERVO LOOP INTEGRATED CIRCUIT SYSTEM TEST CIRCUITRY AND METHOD

CROSS REFERENCE TO RELATED APPLICATION

This application claims the benefit of prior filed co-pending U.S. provisional application Ser. No. 61/029,226 entitled "IMPLEMENT SERVO LOOP HARDWARE ON-CHIP TO REDUCE FINAL TEST COSTS AND ENHANCE TEST RESULTS", filed Feb. 15, 2008 by Mihail Geurevitch and Herbert Braisz, and incorporated herein by reference.

This application also claims the benefit of prior filed co-pending U.S. provisional application Ser. No. 61/072,212 entitled "ON-CHIP SERVO LOOP INTEGRATED CIRCUIT SYSTEM TEST CIRCUITRY AND METHOD", filed Mar. 28, 2008 by Mihail Geurevitch and Herbert Braisz, and incorporated herein by reference.

BACKGROUND OF THE INVENTION

The present invention relates generally to servo loop hardware utilized in testing integrated circuit chips, and more particularly to utilizing additional logic circuitry provided on ADC (analog to digital converter) chips being tested as part of the servo loop hardware, the remaining portion of the servo loop hardware being provided in a test board external to the ADC chips.

Figure 1:
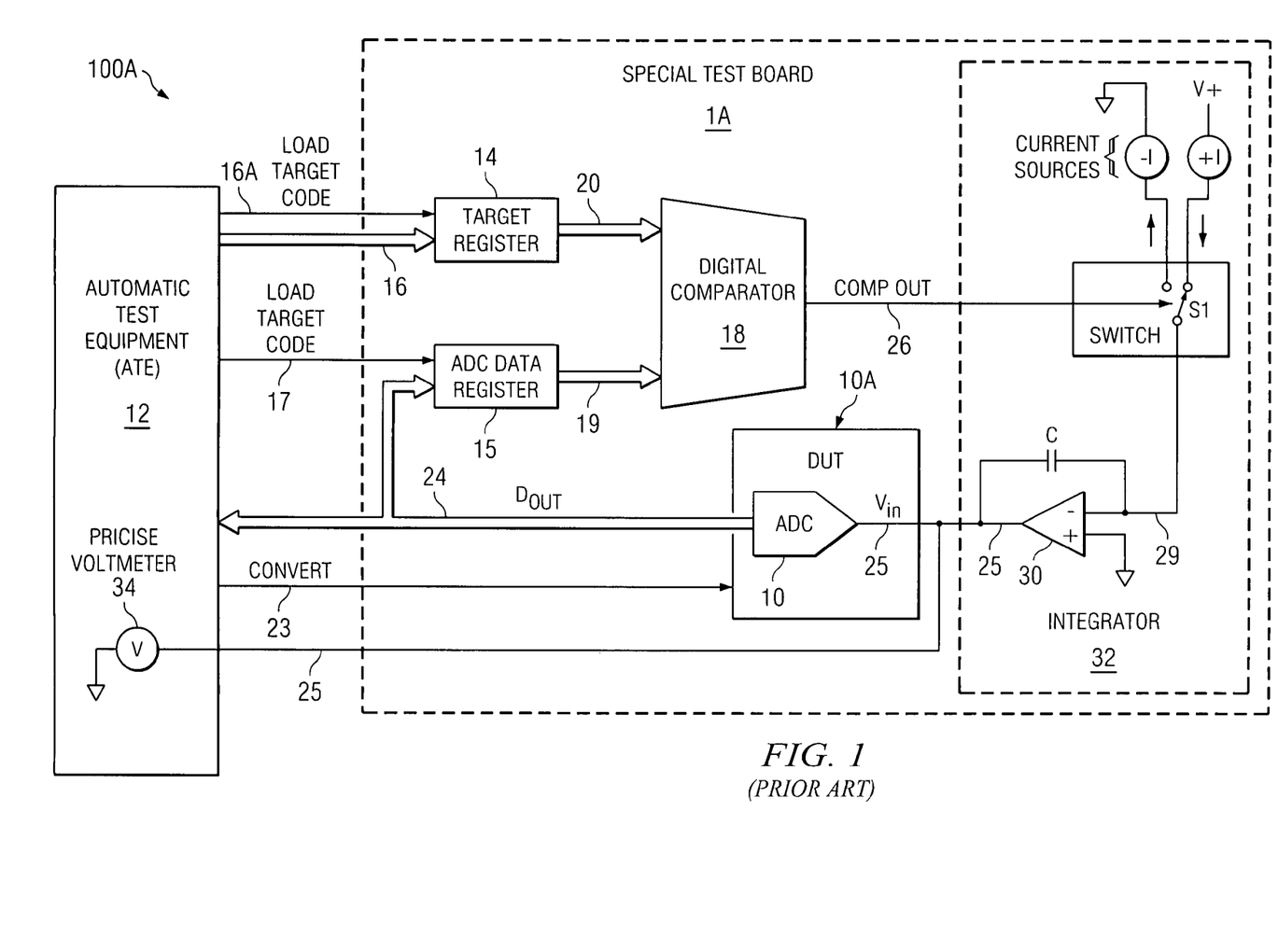
FIG. 1 is a block diagram of a prior art ADC chip testing system wherein all of the servo loop circuitry is included on a special test board for a particular ADC device under test (DUT).

Referring to FIG. 1, prior art ADC test system 100A includes computer-controlled automatic test equipment (ATE) 12, which can be implemented by means of any of a variety of commercially available automatic (i.e., computer-controlled) integrated circuit chip test systems. Automatic test equipment 12 is coupled by control conductor 16A, digital bus 16, control conductor 17, digital bus 24, and control conductor 23 to a "special test board" 1A into which a DUT (device under test) 10A is plugged. An ADC chip 10 to be tested is included in DUT 10A. DUT 10A can also include control circuitry and interface circuitry etc. Special test board 1A also is referred to herein as "servo loop board 1A", and includes a target code register 14, an ADC data register 15, a digital comparator 18, and an integrator 32. Target register 14 has a digital output bus 20 connected to one input of digital comparator 18. ADC data register 15 has a control input connected to control conductor 17 and a digital input connected to digital bus 24. Digital bus 24 is also connected to the digital output of ADC 10 in DUT 10A. ADC data register 15 has a digital output bus 19 connected to another input of digital comparator 18. ADC 10 can, for example, be a 12 bit ADC, in which case the various digital buses are 12 bit buses. The output of digital comparator 18 is connected by conductor 26 to a control terminal of a single pole, double throw switch circuit S1 in integrator 32. Integrator 32 also includes an operational amplifier 30, an integrating capacitor C, a current source −I and another current source +I. The pole terminal of switch circuit S1 is connected by conductor 29 to the (−) input of operational amplifier 30 and to one terminal of integrating capacitor C, the other terminal of which is connected by conductor 25 to the output of operational amplifier 30 and to the input of ADC chip 10. Conductor 25 also is connected to the voltage measuring terminal of a precision voltmeter 34 which is included in automatic test equipment 12. One terminal of switch circuit S1 is connected to current source −I so that a constant current flows out of that terminal to ground. The other terminal of switch S1 is to receive a constant current from current source +I. The voltage Vin on conductor 25 produced by integrator 32 thus ramps up when switch S1 connects conductor 29 to current source −I and ramps down when switch S1 connects conductor 29 to current source +I.

Automatic test equipment 12 can be a very complex, expensive automatic test system or it can be a relatively simple, inexpensive system. Every differently designed ADC chip requires an associated unique "servo loop board" such as 1A which must be designed to interface between the automatic test equipment 12 and the ADC chip 10 to be tested.

A common method for testing a ADC device is to use a "servo loop method". This method is widely used because it reduces the amount of required testing time, averages out noise in the system, and thereby increases the accuracy and repeatability of the test results. For the servo loop method, special servo loop boards which may be very expensive (for example, as much as $3000 each) are required, and in some cases they may not even be available.

When the analog input voltage Vin on conductor 25 is applied to integrated circuit ADC chip 10 in the course of testing it in the prior art system of FIG. 1, the digital output code Dout which is produced by ADC chip 10 has been influenced by noise that inevitably is present in servo loop board 1A, including noise present on the digital bus 24, on power supply conductors (not shown), and on the analog signal Vin applied to the input of ADC 10.

It should be understood that conventional ADC test system 100A measures the values of analog input "transition voltages" of Vin in response to which the ADC digital output signal Dout on bus 24 switches from each digital output level to the next higher digital output level (or to the next lower digital output level). Testing and/or characterization of integrated circuit ADCs is based on the values of such transition voltages. The analog voltage is ramped up and down, and the transition voltage measurement begins when the input signal Vin has "oscillated" up and down around the actual transition voltage for a sufficient amount of time. The sufficient amount of time before starting each transition voltage measurement, i.e., the waiting time before starting the measurement by voltmeter 34, typically should be based on a worst-case ADC testing scenario, for example a scenario in which the initial input voltage Vin applied to the ADC is far from the actual transition voltage. In this worst case scenario, the integrating time before Vin reaches the actual transition voltage will be a long time. The selection of the actual waiting time before starting the voltmeter measurement should be based on that long time. After all of the appropriate transition voltages for the ADC have been measured, converted to digital representations thereof, and stored for future use, then the needed characteristics of the ADC chip can be computed and compared to appropriate reference values to determine if the ADC chip performance is acceptable.

As an example, after an initial target code value has been loaded into target code register 14, the analog input voltage Vin of ADC chip 10 is ramped up (or down) to a voltage level corresponding to the present target code in target code register 14, and ADC chip 10 generates corresponding values of Dout. The corresponding value of Dout might be greater than the present target code value. The purpose of the servo loop is to lower (or increase) the analog input signal Vin until ADC chip 10 provides a value of Dout that is lower than (or greater than or equal to) the target code value in register 14. When this happens, the servo loop reverses the direction of change of Vin on conductor 25, causing it to increase (or decrease).

Vin is repeatedly ramped up and down around the average transition voltage in this manner, depending on the resulting noise-dependent values of the ADC output code Dout. Dout may, for example, be 1-3 LSB (least significant bit) values above or below the present target code value. The number of times Dout "crosses over" from below the present target code value to above that value and vice versa depends on the particular test system and DUT noise levels therein, but a somewhat typical number of crossover times might be 8, depending on the resolution of ADC chip 10. After that number of crossovers has occurred, analog voltmeter 34 makes a relatively slow measurement of Vin over a sufficiently long period (e.g., 20 milliseconds) so as to provide a precise transition voltage wherein the ramping up and down of the input Vin and the various noise components have been averaged. The values of the transition voltage measured by analog voltmeter 34 in automatic test equipment 12 are stored in a memory (not shown) for use in subsequent computations. (For example, the DNL (differential nonlinearity) and INL (integral nonlinearity) characteristics of the ADC can be computed using the transition voltages.) Then another value of the target code is loaded into target code register 14 and the foregoing process is repeated for a desired number of additional target code values.

The increments of Vin which cause each of the one-LSB changes in Dout should be identical, but as a practical matter they are not. The differential nonlinearity (DNL) and integral nonlinearity (INL) characteristics indicate the extent to which the LSB changes are not identical. The difference of the LSB change in each value of Dout from the average LSB change of Dout is the differential nonlinearity DNL. An ideal value of both of the DNL and the INL of an ADC is zero, but as a practical matter some values of the differential nonlinearity can be 10 to 90% greater than or less than the average LSB value. For example, the DNL for this particular code might be 20% greater than average, i.e., +0.2 LSB greater than the average (or −0.2 LSB less than average).

To calculate the differential nonlinearity for every value of Dout, it is necessary to have the values of all of the upper side transition voltages and lower side transition voltages of ADC 10 so that for any particular value of Dout the upper side transition voltage and lower side transition voltage both are captured and stored for subsequent use in the conventional ADC chip testing process. As an example of measurement of an "upper side transition voltage", assume that for a particular value of Vin the ADC performs a conversion and produces a value of Dout equal to 10. Assume that as Vin continues to ramp up a bit more, the ADC produces another conversion of the slightly larger value of Vin, and the result of that conversion is the same value of Dout equal to 10. The ramping up of Vin continues a bit more, and this time the ADC converts a value of Vin to a Dout value of 11. That means the "upper side transition voltage" or "upper border" associated with the Dout value of 10 has been crossed. That causes the output state of digital comparator 18 to change, thereby reversing the direction of ramping of Vin.

Similarly, as an example of measurement of a "lower side transition voltage", assume that for a particular value of Vin the ADC performs a conversion and produces a value of Dout equal to 10. Assume that as Vin continues to ramp down a bit more, the ADC produces another conversion of the slightly smaller value of Vin, and the result of that conversion is the same value of Dout equal to 10. The ramping down of Vin continues a bit more, and this time the ADC converts a value of Vin to a Dout value of 9. That means the "lower side transition voltage" or "lower border" associated with the Dout value of 10 has been crossed. That causes the output state of digital comparator 18 to change, thereby reversing the direction of ramping of Vin.

Figure 2:
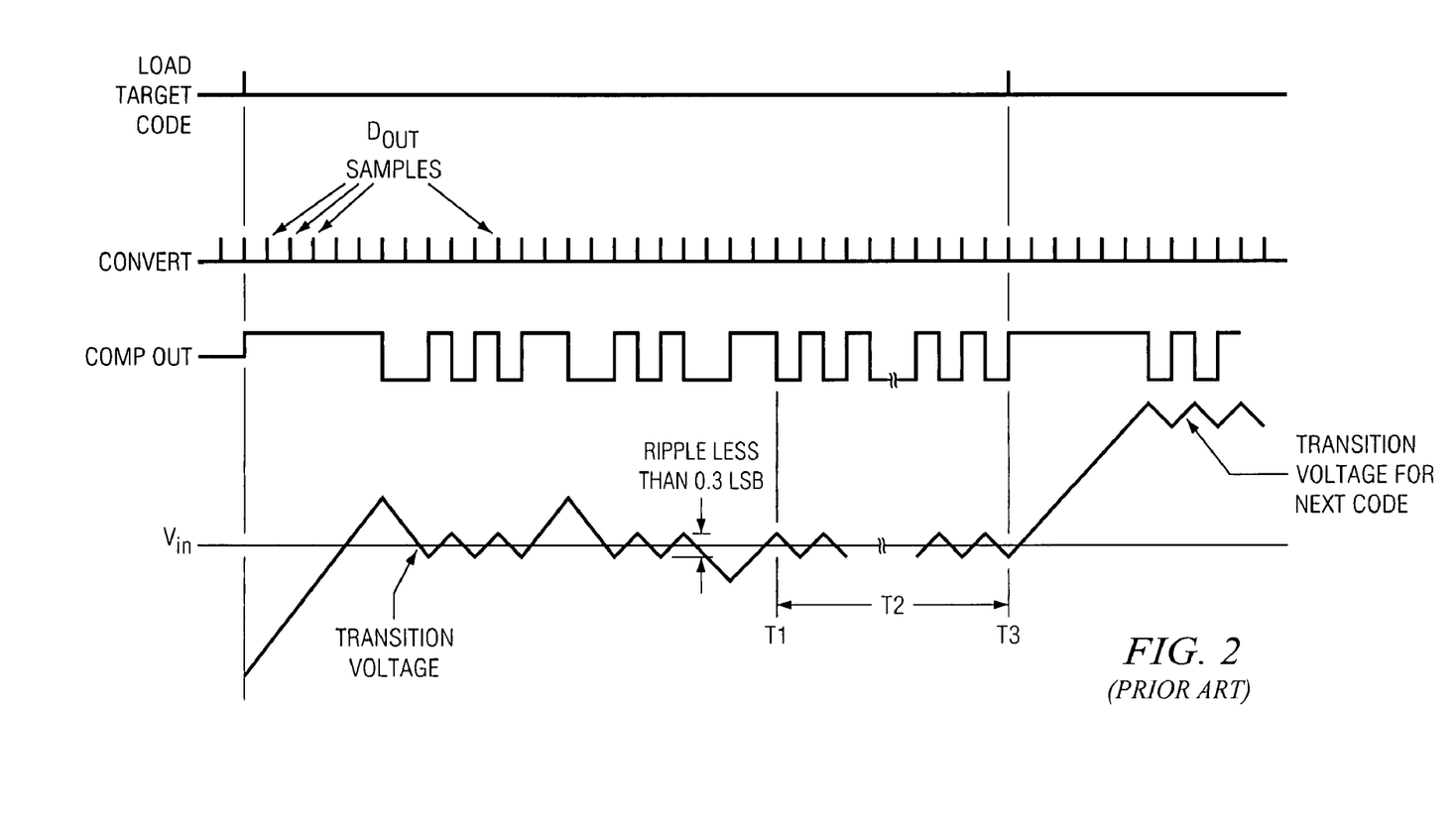
FIG. 2 is a timing diagram which indicates the operation of the prior art ADC chip testing system of FIG. 1.

FIG. 2 shows the waveforms "LOAD TARGET CODE" on conductor 16A, "CONVERT" on conductor 23 and the resulting "Dout SAMPLES" on bus 24, the comparator output "COMP OUT" on conductor 26, and "Vin" generated by integrator 32 on the input conductor 25 of ADC 10. The "LOAD TARGET CODE" waveform indicates times at which a new target code is loaded by automatic test equipment 12 into target code register 14. The COMP OUT waveform indicates the outputs generated by digital comparator 18 on conductor 26 in response to comparison of the Dout samples on bus 24 which have been loaded into ADC data register 15 and applied to one input of digital comparator 18. Each change in the COMP OUT waveform in FIG. 2 causes integrator 32 to reverse the direction of the ramp signal Vin produced on ADC input conductor 25. At time T1 in FIG. 2, automatic test equipment 12 has made a decision to cause analog voltmeter 34 to begin measuring the "transition voltage".

A problem with the system of Prior art FIG. 1 is that sufficient time must be allowed for the above mentioned "worst case" scenario for testing any DUT, and that worst case amount of time may be two or three times as long as the amount of time required for testing a typical DUT of the same kind. The voltmeter measurement during an interval T2 is lengthy because the integrator output voltage Vin on conductor 25 is continuously ramping up and down. Also, longer voltmeter measurement times ensure adequate averaging of the noise that is inherently present on Vin conductor 25 of servo loop board 1A due to the fact that the conductors of Dout bus 24 are changing state after the ADC conversions and imparting noise into the test board. At the end of the voltmeter averaging measurement, which occurs at time T2, a new target code is loaded into target register 14 by automatic test equipment 12, and the foregoing process then is repeated for the new target code.

Note that in FIG. 1, the ADC chip sends out the acquired ADC data Dout via bus 24 to the test system 12 to control the servo loop. The large amount of noise resulting from digital communication of Dout from ADC 10 to the input of digital comparator 18 can result in substantial inaccuracy in the measurement of the above described transition voltages. Consequently, analog voltmeter 34 may need to average its measurement over a much longer time (i.e., a much larger number of ADC conversion times) than would be necessary in the absence of such noise. That noise is added to other electrical noise present on the final test board and contributes substantially to the inaccuracy of each value of Dout produced during the testing of ADC chip 10. This noise can also affect the performance of any additional DUTs of the same kind if they are simultaneously tested on the same servo loop board 1A. Another problem is that a substantial amount of time, e.g. 10 microseconds, may be required to send the digital conversion results from ADC 10 to digital comparator 18 if the servo loop board 1A is implemented by means of a slow data bus, such as a data bus having an I$^2$C data format.

Other available servo loop boards are specially designed for specific automatic test equipment and/or a specific ADC. Such servo loop boards are expensive. Even more expensive general purpose servo loop boards are available, but they typically need adjustments in order to be operable when plugged into final test boards for automatic test equipment. For example, the servo loop user interface, speed, or signal levels of the general purpose servo loop board may not match those used on the DUT to conduct the ADC conversion result Dout to one input of the digital comparator of such a general purpose servo loop board. Also, the general purpose servo loop board might not be operable from the available power supply voltage range. Dealing with such incompatibilities between the automatic test system and the general-purpose servo loop board typically is time-consuming for system debugging, and furthermore is very costly. For example, one general purpose servo loop board containing a servo loop costs about $3000.

Thus, there is an unmet need for a way of testing an ADC device or chip that reduces the amount of test hardware required to implement a servo loop test method of testing the ADC.

There also is an unmet need for a way of testing an ADC device or chip that reduces the amount of test hardware required to implement a servo loop test method of testing the ADC and also substantially improves the conversion accuracy of the ADC during the testing.

There also is an unmet need for a way of testing an ADC device or chip that reduces the amount of test hardware required to implement a servo loop test method of testing the ADC and is easily applicable to testing of any ADC and is not limited to a certain ADC resolution, a specific user interface, a specific interface speed, or a specific automatic integrated circuit chip test system.

There also is an unmet need for a way of testing an ADC device or chip that reduces the amount of test hardware required to implement a servo loop test method of testing the ADC and which reduces the amount of time required to test the ADC.

There also is an unmet need for a way of testing an ADC device or chip that reduces the amount of test hardware required to implement a servo loop test method of testing the ADC and also improves ADC test results by eliminating noise on digital communication lines.

There also is an unmet need for a way of testing an ADC device or chip that reduces the amount of test hardware required to implement a servo loop test method of testing the ADC and also reduces test program debugging time.

There also is an unmet need for a way of testing an ADC device or chip that makes it easy for customers to verify ADC performance data supplied by the manufacturer.

SUMMARY OF THE INVENTION

It is an object of the present invention to provide a way of testing an ADC device or chip that reduces the amount of test hardware required to implement a servo loop test method of testing the ADC.

It is another object of the invention to provide a way of testing an ADC device or chip that reduces the amount of test hardware required to implement a servo loop test method of testing the ADC and also substantially improves the conversion accuracy of the ADC during the testing.

It is another object of the invention to provide a way of testing an ADC device or chip that reduces the amount of test hardware required to implement a servo loop test method of testing the ADC and is easily applicable to testing of any ADC and is not limited to a certain ADC resolution, a specific user interface, a specific interface speed, or a specific automatic integrated circuit test system.

It is another object of the invention to provide a way of testing an ADC device or chip that reduces the amount of test hardware required to implement a servo loop test method of testing the ADC and which reduces the amount of time required to test the ADC.

It is another object of the invention to provide a way of testing an ADC device or chip that reduces the amount of test hardware required to implement a servo loop test method of testing the ADC and also improves ADC test results by eliminating noise on digital communication lines.

It is another object of the invention to provide a way of testing an ADC device or chip that reduces the amount of test hardware required to implement a servo loop test method of testing the ADC and also reduces test program debugging time.

It is another object of the invention to provide a way of testing an ADC device or chip that makes it easy for customers to verify ADC performance data supplied by the ADC manufacturer.

Briefly described, and in accordance with one embodiment, the present invention provides internal servo loop circuitry included on the same chip (10C) with an ADC (10B). Automatic test equipment (12) operates along with the internal servo loop circuitry and external servo loop circuitry (1B) to test the ADC (10B). The internal servo loop circuitry includes a target register (14), a digital comparator (18), and a crossover counter (22). An integrator (32) responsive to the digital comparator (18) produces an input signal (Vin) to the ADC (10B), which generates a corresponding digital output sample (Dout SAMPLE). The digital comparator (18) compares the output sample (Dout SAMPLE) with a target code in the target register (14) and causes the direction of the input signal (Vin) to reverse each time the digital output sample (Dout SAMPLE) crosses over the lower target code border. The counter causes a voltmeter (34) to measure a transition voltage value of the input voltage (Vin) after a predetermined number of crossovers.

In one embodiment, the invention provides an integrated circuit (10C) including an ADC (analog to digital converter) (10B) having an analog input (25) and a digital output (24) and internal servo loop circuitry for use in conjunction with external servo loop circuitry (1B) and automatic test equipment (12) to effectuate testing of the ADC (10B). The internal servo loop circuitry includes a target code register (14) having an input (16A) for receiving target codes from the automatic test equipment (12), a digital comparator (18) having a first input (20) coupled to an output of the target code register (14), and test mode switch circuitry (40) operative in response to the automatic test equipment (12) during testing of the ADC (10B) to couple the digital output (24) of the ADC (10B) to a second input (24A) of the digital comparator (18) and to couple a target code from the automatic test equipment (12) to the input (16A) of the target code register (14). The test mode switch circuitry (40) operates in response to the automatic test equipment (12) during normal operation of the ADC (10B) to decouple the digital output (24) of the ADC (10B) from the second input (24A) of the digital comparator (18) and to connect the digital output (24) of the ADC (10B) to a digital output port (16,24) of the integrated circuit (10C) and to decouple the input (16A) of the target code register (14) from the automatic test equipment (12). The external servo loop circuitry (1B) includes an integrator (32) operative in response to an output (26) of the digital comparator (18) to generate a ramping input signal (Vin) on the analog input (25) of the ADC (10B) during the testing, a voltmeter (34) associated with the automatic test system (12) being coupled to measure transition voltage values of the ramping analog input voltage (Vin) during the testing.

In a described embodiment, the internal servo loop circuitry includes a crossover counter (22) having an input (16A) for receiving reset information from the automatic test equipment (12), a count input (+1) coupled to the output (26) of the digital comparator (18), and an output (28) coupled to control the voltmeter (34). The crossover counter (22) generates a control signal (DONE) on its output (28) after a predetermined number of counts to establish a beginning of an interval (T) during which the voltmeter (34) measures the average value of the ramping (up and down) analog input voltage (Vin).

In a described embodiment, a measurement input terminal (25) of the voltmeter (34) is coupled to receive the ramping input signal (Vin) and the voltmeter (34) is controlled by the automatic test equipment (12) to perform an averaging measurement during the interval (T) to determine each transition voltage value of Vin. The automatic test equipment (12) determines a duration of the interval (T). The ADC (10B) repetitively converts values of the analog input voltage (Vin) to corresponding digital output samples (Dout SAMPLES) in response to the automatic test equipment (12). The duration of the interval (T) is sufficiently long to allow a predetermined level of averaging of noise on the analog input voltage (Vin). The automatic test equipment (12) controls the internal servo loop circuitry and the ADC (10B) so as to measure a sufficient number of transition voltages to enable a predetermined characterization of the ADC (10B) to be determined.

In a described embodiment, the integrator (32) includes an operational amplifier (30) having an output coupled to the analog input (25) of the ADC (10B), a first input coupled to a reference voltage (GND), a second input coupled to a first switch (S1), and an integrating capacitor (C) coupled between the output and second input of the operational amplifier (30), the first switch (S1) being controlled by the output (26) of the digital comparator (18) to reverse directions of current in the integrating capacitor (C). A second switch (S2 (FIG. 6)) is controlled by the control signal (DONE) which freezes the ramping of the analog input voltage (Vin) during measurement of the transition voltage values by the voltmeter (34). The test mode switch circuitry (40) operates in response to the automatic test equipment (12) to couple the output (28) of the crossover counter (22) to a control input (28A) of the voltmeter (34) during the testing of the ADC (10B) and to decouple the output (28) of the crossover counter (22) from the control input (28A) of the voltmeter (34) during normal operation of the ADC (10B).

In one embodiment, the invention provides a method of testing an ADC (10B) included on an integrated circuit chip (10C). The method includes providing internal servo loop circuitry including a target code register (14), a digital comparator (18), and test mode switch circuitry (40) on the integrated circuit chip (10C) for use in conjunction with external servo loop circuitry (1B) and external automatic test equipment (12) for testing the ADC (10B), operating the test mode switch circuitry (40) to load a target code from the automatic test equipment (12) into the target code register (14) and applying the loaded target code to a first input (20) of the digital comparator (18), operating the ADC (10B) in response to the automatic test equipment (12) to generate a digital output sample (Dout) representative of a corresponding sample of the ramping input signal (Vin) on a digital output (24) of the ADC (10B), operating the digital comparator (18) to compare the digital output sample (Dout) of the ADC (10B) to the target code to produce a comparator output signal (26) which changes state if a value of the output sample (Dout) crosses over a value of the target code, operating an integrator (32) in the external servo loop circuitry in response to the comparator output signal (26) to generate a ramping input signal (Vin) the ramping direction of which reverses in response to each state change of the comparator output signal (26) and applying the ramping input signal (Vin) to an analog input (25) of the ADC (10B), operating the automatic test equipment (12) to cause a voltmeter (34) to measure a transition voltage of the ramping analog input voltage (Vin), and repeating the foregoing steps for additional target codes. The crossover counter (22) is operated in response to the comparator output signal (26) to generate a control signal (DONE) after a predetermined number of counts to cause the voltmeter (34) to begin measuring the ramping analog input voltage (Vin).

In one embodiment, the invention provides a system for testing an ADC (10B) included on an integrated circuit chip (10C), including internal servo loop circuitry in the integrated circuit chip (10C) including a target code register (14) and test mode switch circuitry (40) on the integrated circuit chip (10C) for use in conjunction with external servo loop circuitry (1B) and external automatic test equipment (12) for testing the ADC (10B). The system includes means (12) for operating the test mode switch circuitry (40) to load a target code from the automatic test equipment (12) into the target code register (14) and means (20) for applying the loaded target code to a first input (20) of the digital comparator (18), digital comparator means (18) in the integrated circuit chip (10C) for comparing a digital output sample (Dout) of the ADC (10B) to the target code to produce a comparator output signal (26) which changes state if a value of the output sample (Dout) crosses over a value of the target code, integrator means (32) in the external servo loop circuitry in response to the comparator output signal (26) for generating a ramping input signal (Vin) the ramping direction of which reverses in response to each state change of the comparator output signal (26) and applying the ramping input signal (Vin) to an analog input (25) of the ADC (10B), means (12) in the automatic test equipment (12) for operating the ADC (10B) to generate the digital output sample (Dout) representative of a corresponding sample of the ramping input signal (Vin), and means (12) for causing a voltmeter (34) to measure a transition voltage of the ramping analog input voltage (Vin).

DETAILED DESCRIPTION OF THE PREFERRED EMBODIMENTS

The ADC-testing servo loop provided in accordance with the present invention helps to avoid the above described difficulties associated with accurate measurement of ADC analog input "transition voltages" in the presence of the various noise signals in prior servo loop boards used for testing ADC integrated circuit chips. Those difficulties are avoided by integrating part of the logic circuitry needed for the servo loop into each ADC chip, even though that part of the servo loop logic circuitry on the ADC chip is not useful for ordinary utilization of the chip as an ADC by the eventual user/customer.

Figure 3:
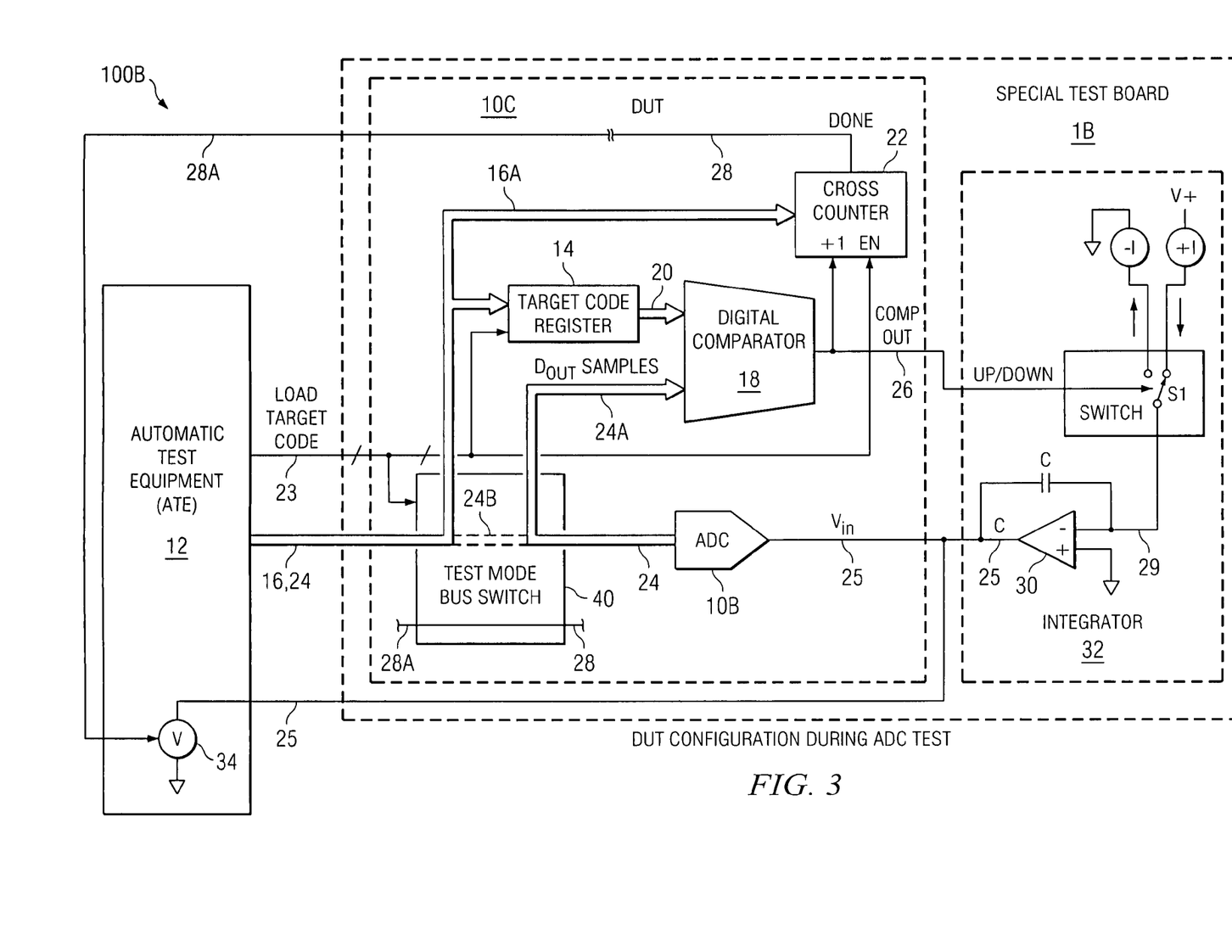
FIG. 3 is a block diagram of an ADC DUT chip of the present invention and a special test board for the ADC DUT chip and a test system, wherein much of the servo loop circuitry of the test system is incorporated in the ADC DUT chip.

Referring to FIG. 3, ADC test system 100B includes automatic test equipment 12 coupled by conductor 28A, control bus 23, Vin conductor 25, and digital bus 16,24 to servo loop board 1B into which a DUT chip 10C is plugged. Automatic test equipment 12 includes analog voltmeter 34, as in Prior Art FIG. 1. In accordance with the present invention, DUT chip 10C includes not only an ADC 10B which is to be used by an eventual customer/user, but also includes part of the servo loop circuitry including target code register 14 and digital comparator 18 of Prior Art FIG. 1, and further includes a test mode bus switch circuit 40, and preferably also includes a crossover counter 22. Special test board 1B in FIG. 3 is referred to as "servo loop board 1B" and includes integrator 32, which can be the same as in Prior Art FIG. 1.

One conductor of control bus 23 controls test mode bus switch 40, another conductor of control bus 23 clocks or enables target code register 14, and yet another conductor of control bus 23 clocks or enables crossover counter 22. A desired number of DUT chips such as 10C along with corresponding integrators such as integrator 32 can be plugged into servo loop board 1B wherein each DUT chip and corresponding integrator has a minimal amount of influence on noise in each of the other DUT chips and corresponding integrators thereof. (A conductor of control bus 23 does not go to ADC 10B because it preferably functions as a self-starting ADC in this test mode.)

It should be appreciated that the eventual customer/user of ADC 10B ordinarily does not utilize the portion of the servo loop circuitry that is included in DUT chip 10C for testing ADC 10B. That portion of the servo loop circuitry has been included in DUT chip 10C in order to substantially improve the conversion accuracy during ADC testing and in order to substantially reduce the overall cost of testing ADC 10B, and also to reduce the amount of time required for the testing.

During ADC testing, test mode bus switch 40 directly connects the digital output bus 24 of ADC 10B to a first input 24A of digital comparator 18. During testing of ADC 10B, test mode bus switch 40 also connects digital bus 16,24 of automatic test equipment 12 directly to the input bus 16A of target code register 14 and crossover counter 22. The output bus 20 of target code register 14 is connected to a second input of digital comparator 18, the output of which is connected by conductor 26 to an "increment-by-one" input (+1) of crossover counter 22 and to a control terminal of switch circuit S1 in integrator 32. (It should be appreciated that crossover counter 22 could be a down counter and instead of an up counter.) The output of integrator 32 is connected by Vin conductor 25 to the analog input of ADC 10B. The output of crossover counter 22 is connected by conductor 28 to a control input 28A of analog voltmeter 34 to cause it to measure transition voltages of Vin. A voltmeter 34 typically is included in automatic test equipment 12. Test mode bus switch circuit 40 can be easily implemented by means of a pair of N-bit pole, double throw switches (where "N" is the number of bits of ADC 10B) that are controlled so as to connect the conductors of digital port 16,24 to corresponding conductors of bus 16A and connect the conductors of digital bus 24 to corresponding conductors of bus 24A during the ADC test mode and to connect the conductors of digital port 16,24 to the corresponding conductors of digital bus 24 while isolating them from buses 16A and 24A during a normal operation mode for ADC 10B. Similarly, test mode bus switch circuit 40 can include a simple switch for connecting conductor 28 to conductor 28A during the ADC test mode.

The test mode bus switch 40 included on DUT chip 10C in FIG. 3 thus provides the function of connecting the analog input Vin and digital output Dout of ADC 10B to the integrated servo loop circuitry to facilitate testing of ADC 10B, and also provides the function of isolating the servo loop circuitry from Vin, Dout, and a control input 28A of voltmeter 34 to allow subsequent normal operation of ADC 10 by a customer/user.

Digital comparator 18 can be, for example, a 12-bit digital comparator which compares the digital output of a 12-bit ADC 10B to a 12-bit target value. In this case, target code register 14 can be a 12-flip-flop register for storing the target code value. Crossover counter 22 counts the number of changes of the digital comparator output COMP OUT on conductor 26 and signals the automatic test equipment 12 by means of the signal DONE on conductor 28 after the count reaches a predetermined value, for example 8. Test mode bus switch 40 allows the target code register 14 to be set and allows crossover counter 22 to be reset, and thereby enables continuously repeated conversions of samples of Vin to be performed to generate corresponding samples of Dout. Test mode bus switch 40 also enables digital comparator 18 to switch the output signals produced by digital comparator 18 and crossover counter 22 to corresponding outputs 26 and 28A, respectively, of DUT chip 10C.

More specifically, crossover counter 22 determines when digital comparator output 26 indicates that Dout has increased above and decreased below the present target code value a particular number of times, for example 8 times. Crossover counter 22 then generates the signal DONE on conductor 28 which is coupled to conductor 28A to cause the averaging measurement of Vin by voltmeter 34. (Note, however, that use of a crossover counter is not essential to determine when analog voltmeter measurements are made of the transition voltages. For example, the analog voltmeter measurements could be taken after a predetermined amount of delay, e.g., after a 10 ms delay, as in Prior Art FIGS. 1 and 2.)

During ADC testing, automatic test equipment 12 sends a target ADC code to target code register 14 in DUT 10C, which compares the noise-dependent Dout samples produced by ADC 10B with the present target code so as to cause the direction of ramping of Vin to be reversed each time Dout "crosses over" to a value either above or equal to or below the target code value. After Dout has crossed over the present target code voltage value a certain suitable number of times, the "DONE" signal is generated by crossover counter 22 so as to cause voltmeter 34 to begin measurement of the average value of Vin over a sufficiently long period of time to average out the ramping values of Vin and associated noise. Then a new target code is loaded into register 14 and the foregoing process is repeated for the new target code.

It should be noted that during the foregoing process, automatic test equipment 12 does not receive the values of Dout on bus 24. This is an important difference from the prior art system shown in FIG. 1, because the noise associated with changing of the various 12 bits to provide each new sample of Dout is not introduced into servo loop board 1B as in the prior art and therefore is not introduced into the ramping signal Vin. This substantially reduces the corresponding noise associated with Dout. Consequently, the testing of ADC 10B is substantially more accurate than has been achievable using the prior art, as shown in Prior Art FIGS. 1 and 2. Furthermore, the amount of time required for testing ADC 10B in FIG. 3 may be substantially reduced in comparison with the amount of time required for testing ADC 10C in Prior Art FIG. 1 because the ADC output data Dout FIG. 3 is presented directly to digital comparator 18 and therefore additional time is not required for shifting it from ADC 10B to automatic test equipment 12.

Figure 4:
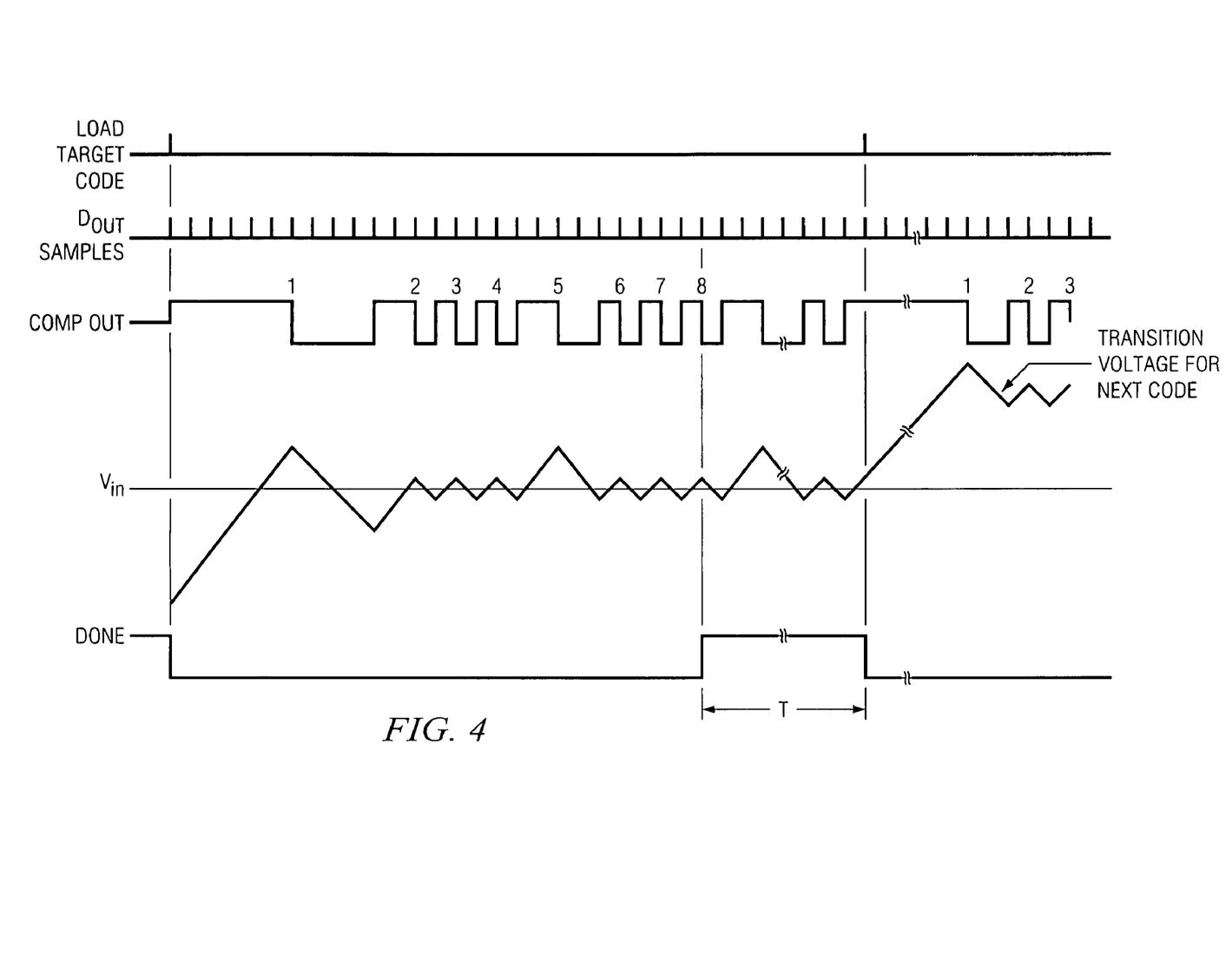
FIG. 4 is a timing diagram which indicates the operation of the ADC DUT chip testing system of FIG. 3.

FIG. 4 shows waveforms of a "LOAD TARGET CODE" signal produced on control bus 23, a "Dout SAMPLES" signal (which now is the DUT internal signal produced on ADC output bus 24 by ADC 10B, which is self-starting during the testing), a "COMP OUT" signal produced on conductor 26 by digital comparator 18, a Vin signal produced on conductor 25 by integrator 32, and a DONE signal produced on conductor 28 by crossover counter 22. The LOAD TARGET CODE waveform indicates times at which a new target code is loaded by automatic test equipment 12 into target code register 14 and times at which crossover counter 22 is reset. A load command is sent to the target code register 14, causing the next target code value to be loaded, and crossover counter 22 is reset to count to a specific number of crossings, for example 8 crossings before generating and other DONE signal. The COMP OUT waveform indicates the output generated by digital comparator 18 on conductor 26 in response to comparison of the Dout samples on bus 24 which have been applied to input 24A of digital comparator 18. Each change in state of the COMP OUT waveform reverses the direction of the ramped Vin signal produced on conductor 25 by integrator 32, resulting in the example Vin waveform shown in FIG. 4.

The first communication between the test board 1B and automatic test equipment 12 after initiation of the testing process is a DONE signal on conductor 28A. In this example, after 8 counts by crossover counter 22 it generates the signal DONE on conductor 28, causing analog voltmeter 34 to begin an averaged measurement of the previously described "transition voltage" of Vin.

The fact that crossover counter 22 determines when to start measurement of the transition voltage is a substantial advantage over the prior art technique of starting measurement of the transition voltage after a predetermined time interval, especially if a number of DUT chips 10C are being tested at the same time, because having crossover counter 22 determine when to start the voltmeter measurement avoids the need for the waiting time required by the prior art before causing voltmeter 34 to start measuring Vin to always be great enough to allow for the worst possible scenario of testing any ADC 10B.

At the end of the voltmeter averaging measurement of Vin, which occurs during a time interval T in FIG. 4, the next desired target code is loaded into target code register 14 by automatic test equipment 12, as indicated by the second pulse of the LOAD TARGET CODE waveform in FIG. 4. The foregoing process then is repeated for as many target codes as are needed to adequately characterize and/or test ADC 10B.

Figure 5:
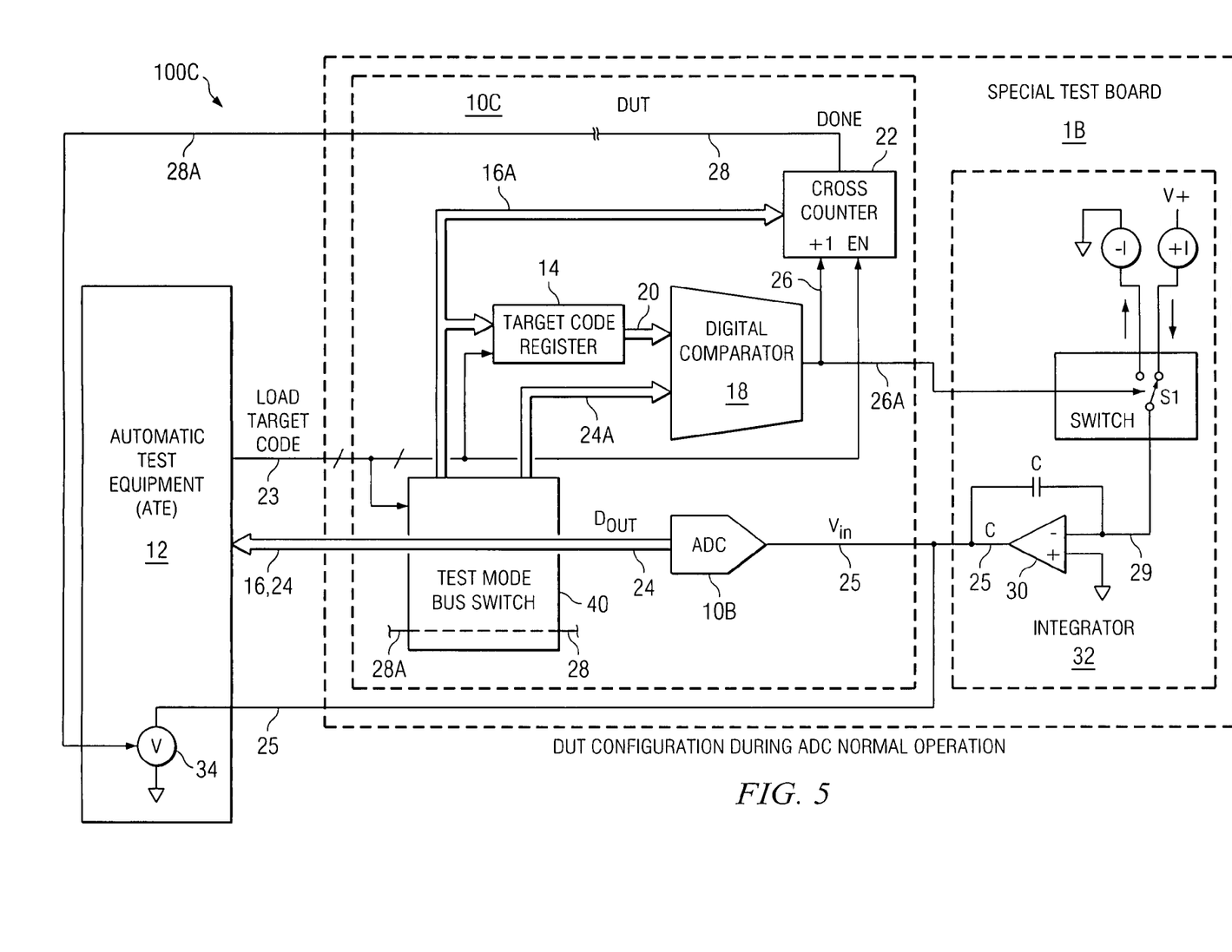
FIG. 5 is a block diagram of the ADC DUT chip and test system of FIG. 3 configured for normal operation of the ADC therein.

After testing of the ADC 10B, the servo loop circuitry integrated into DUT chip 10C along with ADC 10B is effectively disabled so as to be "invisible" to a subsequent user of the ADC. The resulting configuration 100C is shown in FIG. 5, wherein test mode bus switch 40 connects Dout bus 16,24 of ADC 10B directly to the Dout port 24 of DUT 10C, so that during normal operation/use of ADC 10B a customer/user does not "see" inputs 16A and 24A of target code register 14 and digital comparator 18, respectively. Similarly, during normal operation/use of ADC 10B test mode bus switch 40 disconnects conductor 28A from conductor 28 to thereby isolate the eventual customer/user from crossover counter 22.

Figure 6:
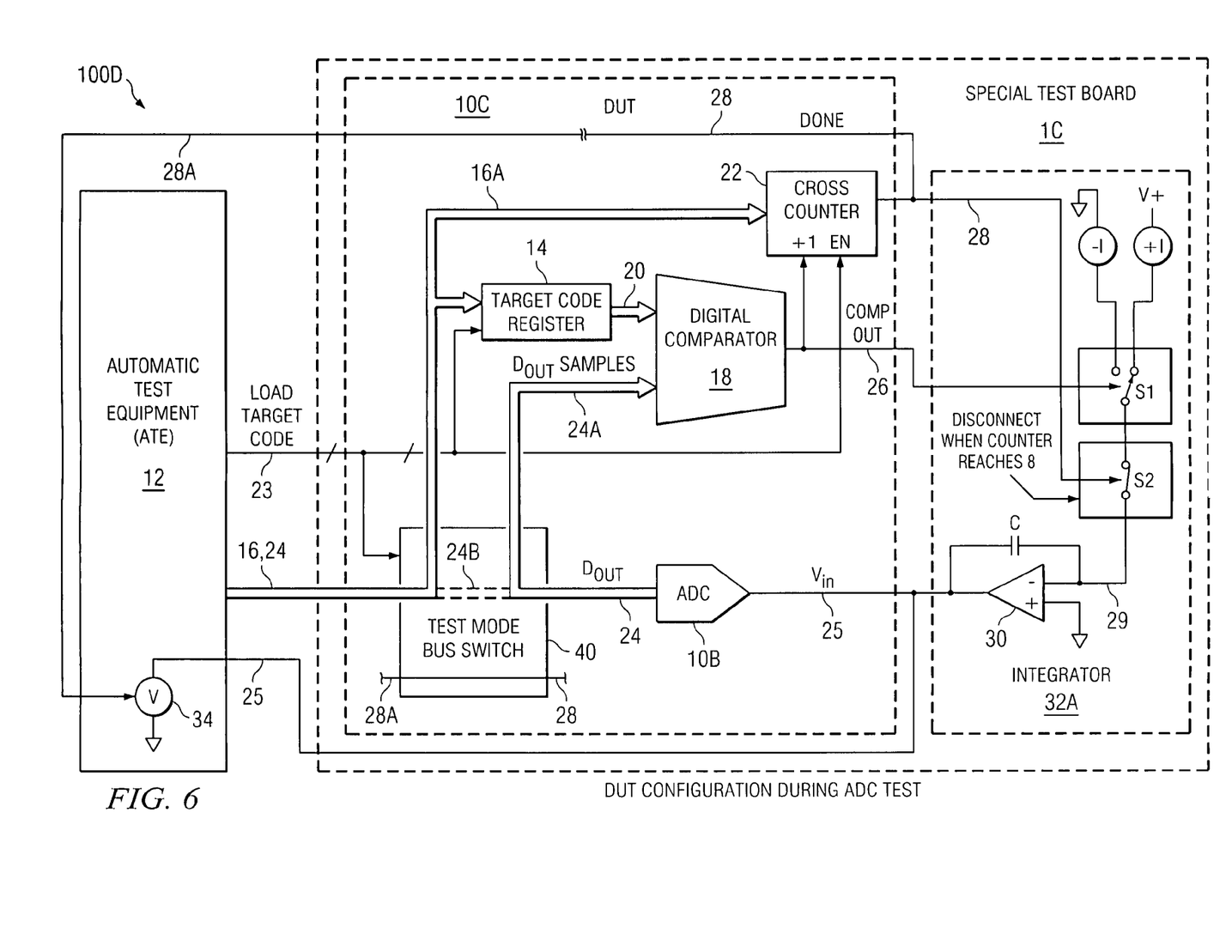
FIG. 6 is a block diagram of the ADC DUT chip as in FIG. 3 with the ADC DUT chip testing system having an additional test mode which freezes the integrator output level and ADC conversion during voltmeter measurement of the integrator output level.
Figure 7:
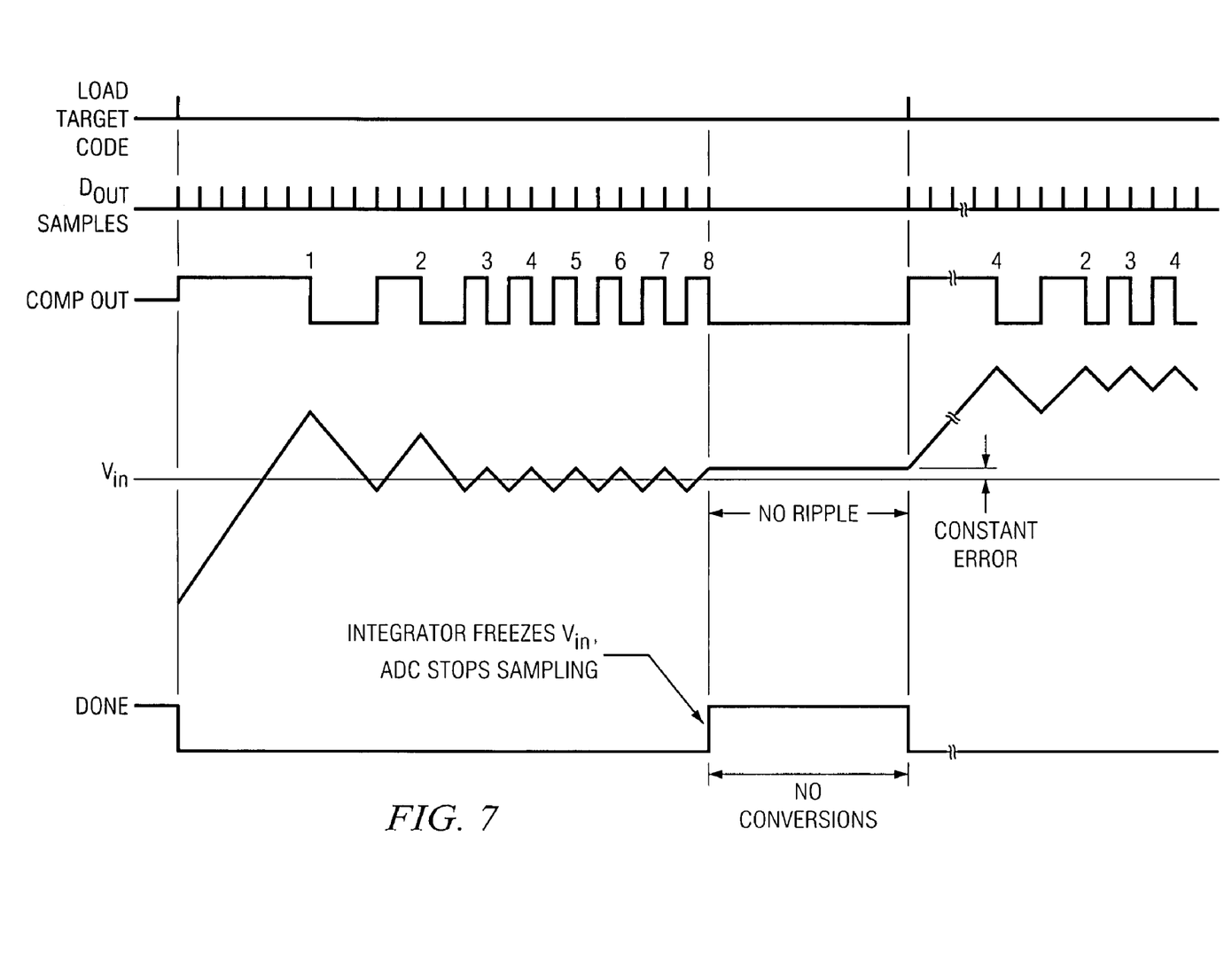
FIG. 7 is a timing diagram which indicates the operation of the ADC DUT chip testing system of FIG. 6.

FIG. 6 shows a variation 100D of ADC test system 100B of FIG. 3, modified to include a somewhat different integrator 32A. Current sources −I and +I in FIG. 6 are connected to switch circuit S1 as in FIG. 3, and conductor 26 is connected to the control terminal of switch S1 as in FIG. 3. However, in FIG. 6 the pole terminal of switch S1 is connected to one terminal of a switch S2 having its other terminal connected by conductor 29 to the (−) input of amplifier 30. The control terminal of switch S2 receives the crossover counter output signal DONE on conductor 28. The other connections of integrator 32A in FIG. 6 are the same as for integrator 32 in FIG. 3. In operation, switch S2 is opened to disconnect the (−) input of operational amplifier 30 from the current sources −I and +I as soon as the DONE signal is generated, whereby Vin remains constant until switch S2 is closed again, after crossover counter 22 is reset. FIG. 7 illustrates this operation wherein the voltage level of Vin is constant during the time when DONE is at a high level, as indicated by the DONE waveform and the Vin waveform. During the same time interval, ADC 10B produces no more Dout samples, as indicated by the Dout SAMPLES waveform in FIG. 7. Consequently, there is no ripple noise on Vin while DONE is at a high level, and therefore, there is no sampling noise associated with sampling of Vin by ADC 10B while Vin is being measured by voltmeter 34. The measurement interval by analog voltmeter 34 therefore can be very short since there is no need for a long averaging interval in order to accurately determine the transition voltages of Vin.

The above described embodiments of the invention are easily used in conjunction with other ADCs having higher or lower resolution and are not limited to any a specific user interface circuitry, any specific interface speed, or any specific automatic integrated circuit test system. The amount of time required for testing the ADC contained in the DUT chip may be reduced because no Dout data needs be exchanged between the DUT and the tester. This substantially improves the accuracy of the ADC testing because noise that otherwise would be generated on the Dout bus is not generated on the servo loop board and therefore is not coupled by the servo loop board to Vin, and therefore does not appear in the samples of Dout. The amount of chip area required to include the target code register, digital comparator, and crossover counter on the chip with the ADC typically will be only a relatively small percentage (i.e., typically less than 1 percent) of the total ADC chip area plus the internal servo loop chip area.

Therefore, the invention reduces the amount of time required for development of an ADC test system and reduces the amount of special servo loop board circuitry required for a new ADC design, and allows more DUT circuits to be provided on one test board and therefore substantially reduces the overall cost associated with making and marketing ADCs. Furthermore, test program debugging time is reduced because there is no need to connect and match the DUT chip 10C to the external servo loop.

By providing the target code register, digital comparator, and optional crossover counter on the same DUT chip with the ADC to be tested, an inexpensive test system can be used in some cases.

Another advantage of the invention is that the customer can very easily verify or determine the characteristics (such as DNL, INL, offset, and gain error) specific to ADC 10, without using expensive test equipment.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the invention is applicable to a DUT which includes two or more ADCs. Crossover counter 22 can be implemented in a variety of ways, either as an up counter or a down counter which can automatically reset itself each time it generates a DONE signal.

What is claimed is:

1. An integrated circuit comprising:
   (a) an ADC (analog to digital converter) having an analog input and a digital output; and
   (b) internal servo loop circuitry for use in conjunction with external servo loop circuitry and automatic test equipment to effectuate testing of the ADC, the internal servo loop circuitry including
      1) a target code register having an input for receiving target codes from the automatic test equipment,
      2) a digital comparator having a first input coupled to an output of the target code register,
      3) test mode switch circuitry operative in response to the automatic test equipment during testing of the ADC to couple the digital output of the ADC to a second input of the digital comparator and to couple a target code from the automatic test equipment to the input of the target code register, and
      4) the test mode switch circuitry being operative in response to the automatic test equipment during normal operation of the ADC to decouple the digital output of the ADC from the second input of the digital comparator and to connect the digital output of the ADC to a digital output port of the integrated circuit and to decouple the input of the target code register from the automatic test equipment,
   the external servo loop circuitry including an integrator operative in response to an output of the digital comparator to generate a ramping input signal on the analog input of the ADC during the testing, a voltmeter associated with the automatic test system being coupled to measure transition voltage values of the ramping analog input voltage during the testing.

2. The integrated circuit of claim 1 wherein the internal servo loop circuitry includes a crossover counter having an input for receiving reset information from the automatic test equipment, a count input coupled to the output of the digital comparator, and an output coupled to control the voltmeter, the crossover counter generating a control signal on its output after a predetermined number of counts to establish a beginning of an interval during which the voltmeter measures the ramping analog input voltage.

3. The integrated circuit of claim 2 wherein a measurement input terminal of the voltmeter is coupled to receive the ramping input signal and the voltmeter is controlled by the automatic test equipment to perform an averaging measurement during the interval to determine each transition voltage value.

4. The integrated circuit of claim 3 wherein the automatic test equipment determines a duration of the interval.

5. The integrated circuit of claim 1 wherein the ADC repetitively converts values of the analog input voltage to corresponding digital output samples.

6. The integrated circuit of claim 4 wherein the duration of the interval is sufficiently long to allow a predetermined level of averaging of noise on the analog input voltage.

7. The integrated circuit of claim 2 wherein the predetermined number of counts is equal to 8.

8. The integrated circuit of claim 1 wherein the automatic test equipment controls the internal servo loop circuitry and the ADC so as to measure a sufficient number of transition voltages to provide a predetermined characterization of the ADC.

9. The integrated circuit of claim 2 wherein the integrator includes an operational amplifier having an output coupled to the analog input of the ADC, a first input coupled to a reference voltage, a second input coupled to a first switch and an integrating capacitor coupled between the output and second input of the operational amplifier, the first switch being controlled by the output of the digital comparator to reverse directions of current in the integrating capacitor.

10. The integrated circuit of claim 9 wherein the integrator includes a second switch controlled by the control signal which freezes the ramping of the analog input voltage during measurement of the transition voltage values by the voltmeter and wherein the ADC does not produce digital output samples while the ramping of the analog input voltage is frozen.

11. The integrated circuit of claim 1 wherein the automatic test equipment includes the voltmeter.

12. The integrated circuit of claim 2 wherein the test mode switch circuitry operates in response to the automatic test equipment to couple the output of the crossover counter to a control input of the voltmeter during the testing of the ADC and to decouple the output of the crossover counter from the control input of the voltmeter during normal operation of the ADC.

13. The integrated circuit of claim 8 wherein the predetermined characterization includes determination of the differential nonlinearity of the ADC.

14. The integrated circuit of claim 9 wherein the second input of the integrator is an inverting input.

15. The integrated circuit of claim 9 wherein the first switch couples the second input of the integrator to a first current source to cause a first current to flow out of the second input of the integrator in response to a first output level of the digital comparator and couples the second input of the integrator to a second current source to cause a second current to flow into the second input of the integrator in response to a second output level of a digital comparator.

16. A method of testing an ADC included on an integrated circuit chip, the method comprising:
   (a) providing internal servo loop circuitry including a target code register, a digital comparator, and test mode switch circuitry on the integrated circuit chip for use in conjunction with external servo loop circuitry and external automatic test equipment for testing the ADC;
   (b) operating the test mode switch circuitry to load a target code from the automatic test equipment into the target code register and applying the loaded first target code to a first input of the digital comparator;
   (c) operating the ADC to generate a digital output sample representative of a corresponding sample of the ramping input signal on a digital output of the ADC;
   (d) operating the digital comparator to compare the digital output sample of the ADC to the target code to produce a comparator output signal which changes state if a value of the output sample crosses over a value of the target code;
   (e) operating an integrator in the external servo loop circuitry in response to the comparator output signal to generate a ramping input signal the ramping direction of which reverses in response to each state change of the comparator output signal and applying the ramping input signal to an analog input of the ADC;

(f) operating the automatic test equipment to cause a voltmeter to measure a transition voltage of the ramping analog input voltage; and (g) repeating steps (b) through (f) a number of times for additional target codes, respectively.

17. The method of claim 16 including operating the test mode switch circuitry in response to the automatic test equipment to allow normal operation of the ADC after the testing by isolating the digital output of the ADC from a second input of the digital comparator and coupling the digital output of the ADC to a digital port of the integrated circuit chip and decoupling an input of the target code register from the digital port.

18. The method of claim 16 wherein the internal servo loop circuitry includes a crossover counter having an input for receiving reset information from the automatic test equipment, the method including incrementing the crossover counter in response to the comparator output signal, and operating the crossover counter to generate a control signal after a predetermined number of counts to cause the voltmeter to begin measuring the ramping analog input voltage.

19. The method of claim 16 including freezing the ramping of the input signal during step (f) and freezing the generation of digital output samples during step (f).

20. A system for testing an ADC included on an integrated circuit chip, comprising:

(a) internal servo loop circuitry in the integrated circuit chip including a target code register and test mode switch circuitry on the integrated circuit chip for use in conjunction with external servo loop circuitry and external automatic test equipment for testing the ADC;

(b) means for operating the test mode switch circuitry to load a target code from the automatic test equipment into the target code register and means for applying the loaded target code to a first input of the digital comparator;

(c) digital comparator means in the integrated circuit chip for comparing a digital output sample of the ADC to the target code to produce a comparator output signal which changes state if a value of the output sample crosses over a value of the target code;

(d) integrator means in the external servo loop circuitry in response to the comparator output signal for generating a ramping input signal the ramping direction of which reverses in response to each state change of the comparator output signal and applying the ramping input signal to an analog input of the ADC;

(e) means in the automatic test equipment for operating the ADC to generate the digital output sample representative of a corresponding sample of the ramping input signal; and (f) means for causing a voltmeter to measure a transition voltage of the ramping analog input voltage.

21. The system of claim 20 including means for operating the test mode switch circuitry for allowing normal operation of the ADC after the testing by isolating the digital output of the ADC from the digital comparator and coupling the digital output of the ADC to a digital port of the integrated circuit and decoupling the target code register from the digital port.

* * * * *

UNITED STATES PATENT AND TRADEMARK OFFICE
CERTIFICATE OF CORRECTION

PATENT NO.        : 7,724,014 B2                                    Page 1 of 1
APPLICATION NO.   : 12/150042
DATED             : May 25, 2010
INVENTOR(S)       : Mihail Gurevitch and Herbert Braisz

It is certified that error appears in the above-identified patent and that said Letters Patent is hereby corrected as shown below:

Title Page
Under Related U.S. Application Data, please add Domestic Priority:

-- Provisional Application No. 61/029,226, filed on February 15, 2008 --

Signed and Sealed this

Second Day of November, 2010

David J. Kappos
*Director of the United States Patent and Trademark Office*